United States Patent [19]
Valenti et al.

[11] Patent Number: 5,825,089
[45] Date of Patent: Oct. 20, 1998

[54] LOW THERMAL RESISTANCE SPRING BIASED RF SEMICONDUCTOR PACKAGE MOUNTING STRUCTURE

[75] Inventors: Gregory P. Valenti, Mountain View; Howard D. Bartlow, West Linn; David S. Piazza, Santa Clara, all of Calif.

[73] Assignee: Spectrian, Inc., Sunnyvale, Calif.

[21] Appl. No.: 722,698

[22] Filed: Sep. 30, 1996

Related U.S. Application Data

[63] Continuation of Ser. No. 443,799, May 18, 1995, abandoned, which is a continuation-in-part of Ser. No. 37,508, Mar. 24, 1993, which is a continuation of Ser. No. 694,424, May 1, 1991, abandoned.

[51] Int. Cl.$^6$ .................................................. H01L 23/34
[52] U.S. Cl. .................... 257/718; 257/719; 257/726; 257/727; 361/710; 361/711; 361/719
[58] Field of Search ..................................... 257/718, 719, 257/726, 727; 361/709, 710, 711, 712, 719

[56] References Cited

U.S. PATENT DOCUMENTS

| | | | |
|---|---|---|---|
| 3,636,415 | 1/1972 | Kruer | 317/234 |
| 3,777,238 | 12/1973 | Rabut | 317/234 R |
| 4,141,028 | 2/1979 | Hulstrunk | 357/68 |
| 4,259,685 | 3/1981 | Romano | 357/81 |
| 4,649,460 | 3/1987 | Marchisi et al. | 361/386 |
| 4,672,422 | 6/1987 | Schierz | 357/82 |
| 4,768,352 | 9/1988 | Maruyama | 62/383 |
| 4,965,658 | 10/1990 | Norbeck et al. | 357/79 |

*Primary Examiner*—David Ostrowski
*Attorney, Agent, or Firm*—Townsend and Townsend and Crew, LLP; Henry K. Woodward

[57] ABSTRACT

A ceramic package and mounting structure which requires less surface area on a heat sink and improves heat transfer to the heat sink. Each ceramic package has a top side and a bottom side with the bottom side being flat and smooth. The bottom side can be a polished ceramic, or metal layer which is plated or brazed to the bottom side. The mounting structure includes a clamp and a spring in pressure engagement with the top side of the package for maintaining the package in pressure engagement with the heat sink.

19 Claims, 4 Drawing Sheets

COOLANT

LOW THERMAL RESISTANCE SPRING BIASED RF SEMICONDUCTOR PACKAGE MOUNTING STRUCTURE

This is a Continuation of application Ser. No. 08/443,799, filed May 18, 1995, now abandoned; which is a continuation-in-part of copending application no. 08/037,508 filed Mar. 24, 1993, which is a continuation of application Ser. No. 07/694,424 filed May 1, 1991, now abandoned for "Low Thermal Resistance Semiconductor Package and Mounting Structure."

BACKGROUND OF THE INVENTION

This invention relates generally to packaged RF semiconductor circuit devices, and more particularly the invention relates to a low thermal resistance RF semiconductor device and mounting structure.

Semiconductor circuits and components for RF and microwave applications are typically mounted in ceramic packages which provide desired electrical isolation for the device. In power devices such as microwave amplifier transistors, the ceramic package must be mounted to a heat sink to remove heat from the device. Low thermal resistance is required between the package and heat sink to improve operation and prevent device failure.

Heretofore, the undersides of ceramic packages have included refractory metal layers such as molybdenum-manganese-gold and tungsten-gold with or without nickel layers. These metallizations are not flat and often build up in thickness around the ceramic edges and corners. However, these uneven metal layers are not a problem when the package is brazed to a mounting flange. The flange is then affixed to a heat sink. Use of the mounting flange significantly increases the "footprint" or surface area on the heat sink required for mounting the package, but elimination of the flange adversely affects heat transfer from the conventional package to the heat sink because of the uneven metal layers.

The present invention is directed to a spring biased mounting structure which maintains a flat ceramic package in pressure engagement with a support structure during temperature cycling and without exceeding a destructive critical pressure on the package.

SUMMARY OF THE INVENTION

An object of the present invention is an improved semiconductor device package and mounting structure for maintaining a package in pressure engagement with a support surface.

Another object of the invention is a semiconductor package having a smaller footprint while decreasing thermal resistance to a heat sink.

Yet another object of the invention is a semiconductor device package which is low in cost and reproducible.

Still another object of the invention is a mounting structure for an RF and microwave semiconductor device which has low impedance for the packaged device.

Briefly, in accordance with the invention a ceramic package for a semiconductor device is provided with a smooth and flat bottom side which can abut directly with a heat sink without the need for a mounting flange. The bottom side surface can be the ceramic surface or a metal surface which is bonded or brazed to the bottom side ceramic surface or plated on a conventional refractory metal surface. The package is maintained in pressure engagement with the heat sink by a spring biased mounting fixture which engages the top surface of the package, whereby pressure engagement is maintained during temperature cycling. Further, the spring engagement of the package reduces the possibility of applying a destructive force to the package when assembling the mounting structure.

In one embodiment a metal bar or clamp includes springs which provide pressure to the top of two spaced packages with a fastener extending through the clamp into the heat sink. Sufficient pressure is maintained on the packages by the springs to assure adequate heat transfer without physically damaging the package during temperature cycling.

The invention and objects and features thereof will be more readily apparent from the following detailed description and appended claims when taken with the drawing.

DETAILED DESCRIPTION OF PREFERRED EMBODIMENTS

Figure 1:
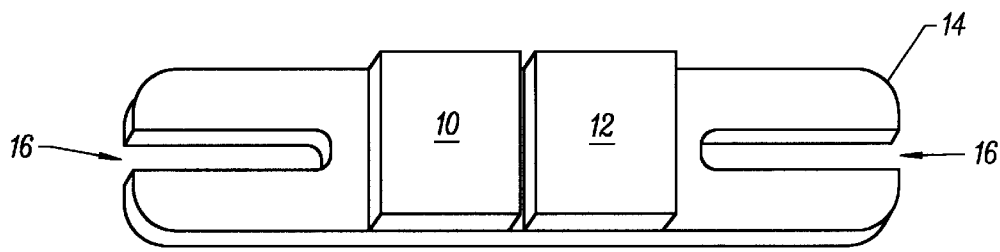
FIG. 1 is a perspective view of ceramic packages mounting with a flange in accordance with the prior art.

Referring now to the drawings, FIG. 1 is a perspective view of two ceramic packages 10, 12 mounted on a metal flange 14 in accordance with the prior art. The ceramic packages 10, 12 can have wrap around metallization or through hole metallization to the underside of the ceramic package for good low inductance grounding. Typically the metallization comprises multiple metal layers including a refractory metal layer, such as molybdenum-magnesium-gold and tungsten-gold with or without a nickel layer thereon. As noted above, such metal layers are not flat or smooth and often build up in thickness around the ceramic edges and corners. However, this is not a problem when the package is brazed to the flange 14.

Figure 2:
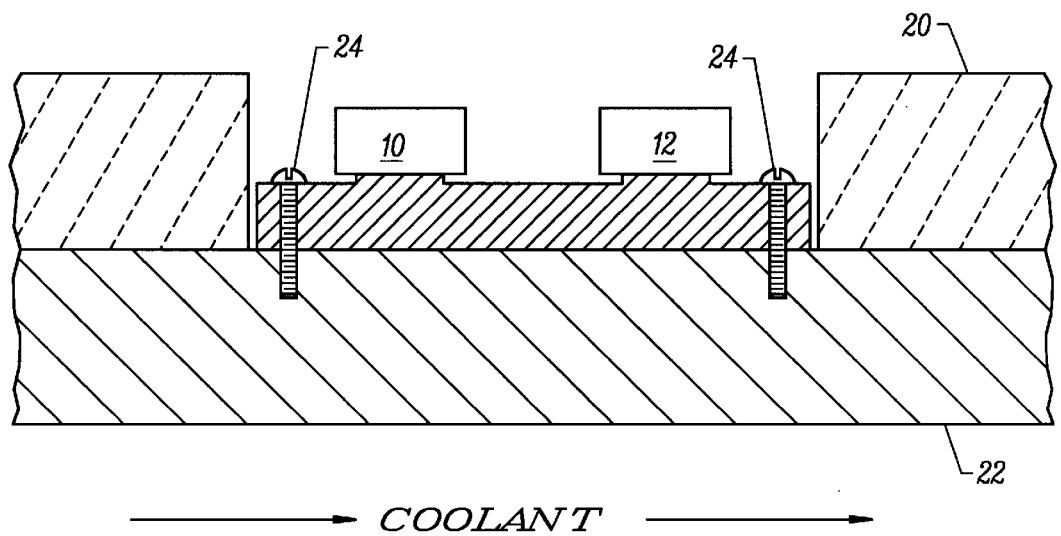
FIG. 2 is a section view illustrating the mounting of the package and flange of FIG. 1 on a heat sink.

FIG. 2 is a section view illustrating the mounting of the packages 10, 12 and flange 14 through a hole in a printed circuit board 20 and in contact with a surface with a heat sink 22. Typically, the heat sink 22 has a plurality of fins on the surface opposing the flange 14 which are cooled by the flow of a coolant. Screws 24 extend through slots 16 in either end of the flange 14 and fasten the flange and packages to the heat sink 22. As noted above, the use of the flange 14 increases the "footprint" or surface area on the heat sink and the size of the hole through the printed circuit board 20 which accommodates the flange. Further, medium-sized and larger packages can only be brazed over a small area (less than 0.300" in diameter) to minimize ceramic cracking. Typically, the flange will have small raised pedestals on which the packages are brazed. This small braze area raises thermal resistance significantly.

Figure 3:
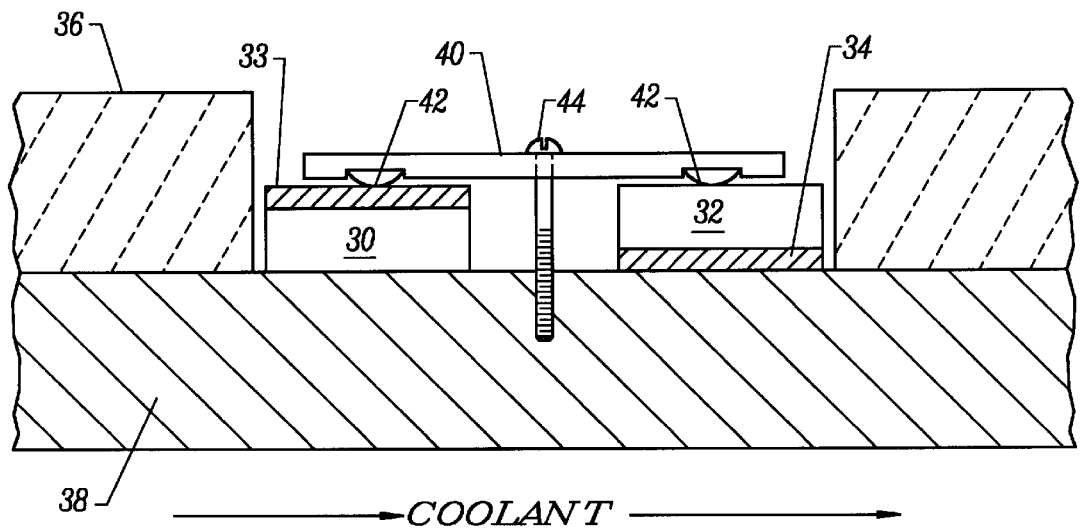
FIG. 3 is a section view of two ceramic packages and a mounting structure in accordance with one embodiment of the invention.

FIG. 3 is a section view of ceramic packages and mounting structure is accordance with one embodiment of the invention. For illustration purposes the ceramic package 30 has metallization 33 on the tope side and the bottom side is a polished ceramic which abuts heat sink 38; the package 32 has metallization 34 on the bottom side surface which engages directly with heat sink 38. Again, the packages are positioned through an opening in printed circuit board 36 to abut the heat sink. However, since a flange is not employed in mounting the packages to the heat sink, the opening through the printed circuit board 36 can be smaller in size than the opening through the printed circuit board in FIG. 2.

The mounting structure for the packages 30, 32 includes a metal bar or clamp 40 and a fastener 44 which threadibly engages the heat sink 38. The clamp bar 40 supports springs 42 which exert pressure on the packages 30, 32 to maintain good thermal transfer from the packages to the heat sink during temperature cycling. In this embodiment the springs 42 comprise leaf springs, positioned in recesses in clamp 40, as described further hereinbelow with reference to FIGS. 5–7. The mounting structure may also provide an electrical connection from the top side metallization 33 to the grounded heat sink.

To facilitate good heat transfer from the packages to the heat sink, the bottom side surfaces must be smooth. The package 30 has a ceramic bottom side surface which is polished to be very flat and smooth. Alternatively, the package 32 has metallization on the bottom side surface which can be readily polished for a smooth and flat surface. Thus a non flat and rough ceramic bottom side can be brazed or plated with a thermally conductive metal such as silver or copper to a thickness of several thousandths of an inch, and this layer is then smoothed and flattened. Advantageously, the smoothing step is repeatable if the surface is damaged or an upgrade of flatness or smoothness is desired. In another embodiment, the ceramic bottom side can be plated in the normal way using a refractory metal layer and then a suitable metal such as silver or copper is plated on the first metal layer. The plated layer can be smoothed and flattened until desired characteristics are obtained. Flattening and smoothing of the initial standard metallization is generally not possible without exposing ceramic at edges and corners which can degrade the package electric performances.

Figure 4:
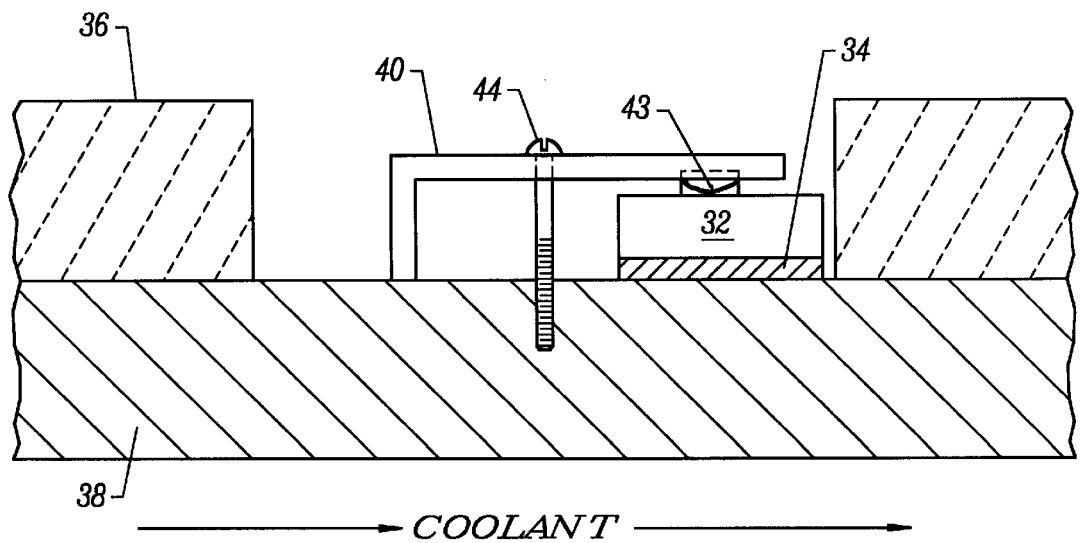
FIG. 4 is a section view illustrating a semiconductor package and mounting structure in accordance with another embodiment of the invention.

FIG. 4 is another embodiment of the mounting structure in accordance with the invention for affixing a single package to a heat sink. In this embodiment the clamp 40 and spring 42 engage the package 32 in a manner similar to that illustrated in FIG. 3, but the opposing end of clamp 40 is configured to engage the heat sink 38. Thus, the mounting of a single package is accommodated.

Figure 5:
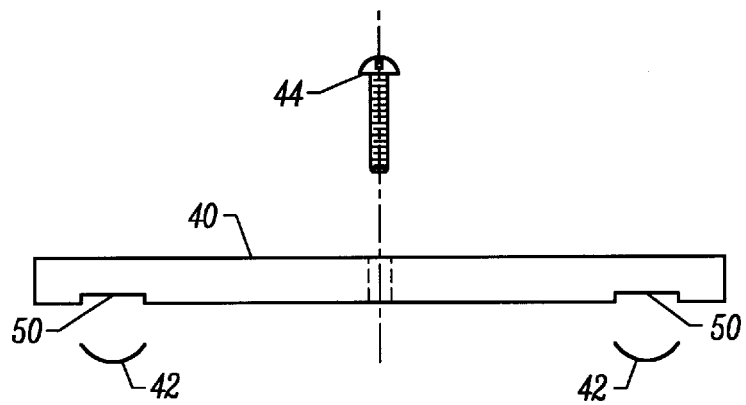
FIG. 5 is an exploded view of the clamp and springs of FIG. 3.

FIG. 5 is an exploded view of the clamp 40 and spring 42 of FIG. 3. Clamp 40 has two grooves 50 in a bottom surface which receives two flexed springs fabricated from 0.008 to 0.012 inch thick tempered steel spring stock. Other suitable materials can be used in the springs. In this embodiment each spring member is 0.250 inch wide and 0.400 inch in length. The grooves 50 are less than 0.400 inch in length thus necessitating the flexing of the springs for assembly in the grooves.

Figure 6A:
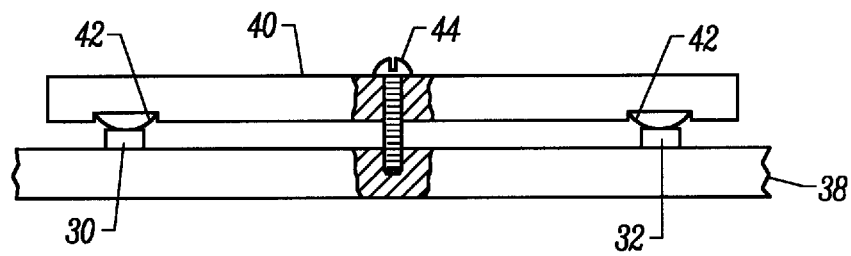
FIGS. 6A, 6B illustrate the assembly of the clamp and springs holding ceramic packages to a support surface.
Figure 6B:
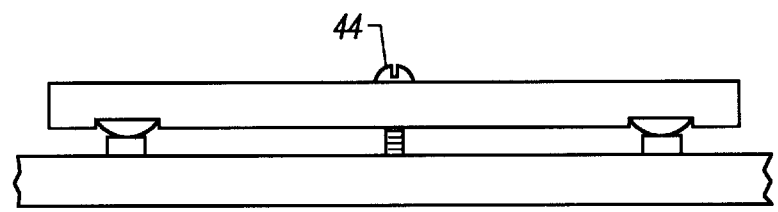

FIG. 6A illustrates the clamp assembled to the support plate or pallet 38 with the springs touching the ceramic packages 32 in uncompressed contact. Further tightening of screw 44 forces the springs in pressure engagement with the package 32 as illustrated in FIG. 6B, as noted by the flattening of the spring surfaces engaging the packages. Thus, the springs can maintain a pressure engagement with the packages during temperature cycling. Damage to the packages when applying the pressure engagement is minimized by use of the spring contacts.

Figure 7A:
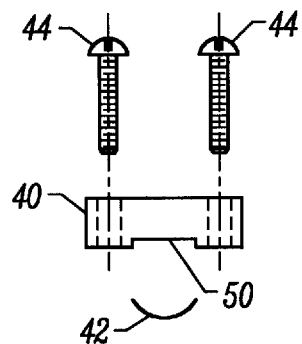
FIGS. 7A, 7B illustrate an alternative embodiment of the mounting structure.
Figure 7B:
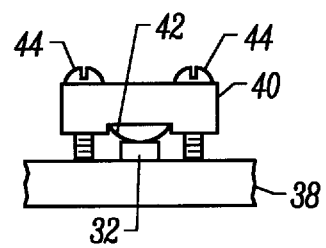

FIGS. 7A, 7B illustrate an alternative embodiment of a mount for attaching a single package to a substrate. The embodiment is similar to the embodiment of FIG. 5, and like elements have the same reference numerals. The exploded view of FIG. 7A illustrates the clamp 40 having a single groove 50 for receiving a single leaf spring 42. Two screws 44 pass through clamp 40 and threadibly engage a supporting substrate 38 with the spring 42 engaging a ceramic package 32 in pressure engagement, as shown in FIG. 7B.

Infrared scans of essentially identical parts in standard packages and packages in accordance with the invention have demonstrated a 20–40% improvement in junction to heat sink thermal resistance. The mounting structure has proved to be reliable, low cost, and readily reproducible.

While the invention has been described with reference to specific embodiments, the description is illustrative of the invention and is not to be construed as limiting the invention. For example, the leaf springs can be replaced by coil springs. Thus, various modifications and applications may occur to those skilled in the art without departing from the true spirit and scope of the invention as defined by the appended claims.

What is claimed is:

1. A spring biased clamp for mounting a radio frequency and microwave circuit in a ceramic package on a supporting substrate comprising a clamp bar having a top surface and a bottom surface, at least one groove in said bottom surface for receiving a spring, a spring positioned in said groove and extending below said bottom surface for engaging a ceramic package, and fastener means extending through said clamp bar for engaging a supporting substrate and maintaining a ceramic package in pressure engagement with said spring, said clamp bar and fastener means characterized by low radio frequency impedance when mounting a ceramic package in a larger circuit.

2. The spring biased clamp as defined by claim 1 wherein said spring comprises a leaf spring.

3. The spring biased clamp as defined by claim 2 wherein said clamp bar has two grooves for receiving two springs.

4. The spring biased clamp as defined by claim 3 wherein said fastener means comprises a screw positioned between said two grooves.

5. The spring biased clamp as defined by claim 1 wherein said clamp bar has one groove for receiving one spring.

6. The spring biased clamp as defined by claim 5 wherein said fastener means includes two screws with a screw positioned on either side of said groove.

7. The spring biased clamp as defined by claim 5 wherein said spring comprises a leaf spring.

8. A combination comprising at least one ceramic semiconductor device package having a top side and a bottom side, said bottom side of said ceramic package comprises a smooth ceramic surface, a heat sink having a top surface, said ceramic package being positioned on said heat sink with said bottom side abutting said top surface, and means for maintaining said ceramic package in pressure engagement with said heat sink including a clamp and spring configured to exert pressure on said top side and a fastener extending through said clamp and engaging said heat sink, said clamp including a bar having top and bottom surfaces, said bottom surface including at least one groove for receiving a spring.

9. The combination as defined by claim 8 wherein said top side includes a metal layer which functions as a ground.

10. A combination comprising at least one ceramic semiconductor device package having a top side and a bottom side, said bottom side of said ceramic package comprising a thermally conductive metal attached to said ceramic package by one of the group consisting of bonding, brazing, and plating, a heat sink having a top surface, said ceramic package being positioned on said heat sink with said bottom side abutting said top surface, and means for maintaining said ceramic package in pressure engagement with said heat sink including a clamp and spring configured to exert pressure on said top side and a fastener extending through said clamp and engaging said heat sink, said clamp including a bar having top and bottom surfaces, said bottom surface including at least one groove for receiving a spring.

11. The combination as defined by claim 10 wherein said thermally conductive metal functions as a ground.

12. The combination as defined by claim 11 wherein said thermally conductive metal comprises a first metal layer including a metal brazed to said ceramic package and a second metal layer plated on said first metal layer.

13. The combination as defined by claim 12 wherein said thermally conductive metal functions as a ground.

14. A combination comprising at least one ceramic semiconductor device package having a top side and a bottom side, a heat sink having a top surface, said ceramic package being positioned on said heat sink with said bottom side abutting said top surface, and means for maintaining said ceramic package in pressure engagement with said heat sink including a clamp and spring configured to exert pressure on said top side and a fastener extending through said clamp and engaging said heat sink, said clamp including a bar having top and bottom surfaces, said bottom surface including at least one groove for receiving a spring, said clamp further including offset portions whereby one portion engages said top surface of said heat sink and another portion exerts pressure on said top side of said ceramic package through said spring.

15. The combination as defined by claim 14 wherein at least one ceramic package has a metal layer on its top side.

16. The combination as defined by claim 15 wherein said metal layer functions as a ground, said clamp and fastener electrically connecting said metal layer to said heat sink.

17. The combination as defined by claim 14 wherein at least one package has a metal layer on its bottom side which electrically and thermally engages said heat sink.

18. The combination as defined by claim 17 wherein said metal layer comprises a first metal layer including a metal brazed to said ceramic package and a second metal layer plated on said first metal layer.

19. A combination comprising two ceramic packages having top sides and bottom sides, a heat sink having a top surface, said ceramic packages being positioned on said heat sink with said bottom sides abutting said top surface, and means for maintaining said ceramic packages in pressure engagement with said heat sink including a clams and spring configured to exert pressure on said top sides and a fastener extending through said clamp and engaging said heat sink, said clamp including a bar having top and bottom surfaces, said bottom surface including at least one groove for receiving a spring, said ceramic packages being positioned in spaced alignment on said heat sink with said bottom sides abutting said top surface, said clamp and two springs exerting pressure on said top sides of said ceramic packages, said fastener extending through said clamp between said packages and engaging said heat sink.

* * * * *